United States Patent
Chi et al.

(10) Patent No.: US 9,064,865 B2
(45) Date of Patent: Jun. 23, 2015

(54) MECHANISMS FOR FORMING GATE DIELECTRIC LAYER

(71) Applicant: Taiwan Semiconductor Manufacturing Co., Ltd, Hsin-Chu (TW)

(72) Inventors: Liang-Chen Chi, Hsinchu (TW);
Chia-Ming Tsai, Zhubei (TW);
Chin-Kun Wang, Hsinchu (TW);
Jhih-Jie Huang, Taipei (TW);
Miin-Jang Chen, Taipei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/052,332

(22) Filed: Oct. 11, 2013

(65) Prior Publication Data

US 2015/0102431 A1    Apr. 16, 2015

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)
*H01L 29/51* (2006.01)
*H01L 21/28* (2006.01)

(52) U.S. Cl.
CPC ........ *H01L 29/511* (2013.01); *H01L 21/28008* (2013.01)

(58) Field of Classification Search
CPC ................... H01L 21/28008; H01L 29/511
USPC ......................................................... 257/511
See application file for complete search history.

(56) References Cited

U.S. PATENT DOCUMENTS 6,020,024 A * 2/2000 Maiti et al. .................... 438/287
7,316,950 B2 * 1/2008 Park et al. ..................... 438/199

* cited by examiner

*Primary Examiner* — David S Blum
(74) *Attorney, Agent, or Firm* — Birch, Stewart, Kolasch & Birch, LLP

(57) ABSTRACT

Embodiments of mechanisms for forming a semiconductor device are provided. The semiconductor device includes a semiconductor substrate and a nitride buffer layer over the semiconductor substrate, and the nitride buffer layer is in an amorphous state. The semiconductor device also includes a crystalline gate dielectric layer over the nitride buffer layer and a gate electrode over the crystalline gate dielectric layer.

20 Claims, 6 Drawing Sheets

MECHANISMS FOR FORMING GATE DIELECTRIC LAYER

BACKGROUND

The semiconductor integrated circuit (IC) industry has experienced rapid growth. Technological advances in IC materials and design have produced generations of ICs. Each generation has smaller and more complex circuits than the previous generation.

Size reduction of the metal-oxide-semiconductor field-effect transistor (MOSFET) has enabled the continued improvement in speed performance, density, and cost per unit function of integrated circuits over the past few decades. As the MOSFET scaling down process continues, the area of the gate dielectric layer of the MOSFET is scaled down as well. The relationship between the gate capacitance (C), the dielectric constant (∈, which is also called the permittivity), the area (A) and the physical thickness (T) of the gate dielectric layer are shown in Formula (1):

$$C = \frac{\varepsilon \times A}{T}. \quad \text{Formula (1)}$$

As shown in Formula (1), the scaling down of the area (A) of the gate dielectric layer reduces the gate capacitance (C). Since the performance (i.e. drain saturation currents) of the MOSFET is proportional to the gate capacitance (C), the performance is reduced as the gate capacitance (C) is reduced.

The gate capacitance and the performance may be maintained by the scaling down of the thickness of the gate dielectric layers. However, the scaling down of the gate dielectric thickness results in a large gate leakage current.

BRIEF DESCRIPTION OF THE DRAWINGS

For a more complete understanding of the embodiments, and the advantages thereof, reference is now made to the following descriptions taken in conjunction with the accompanying drawings.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

The relationship between the gate capacitance (C), the area (A), the dielectric constant ($\varepsilon_{SiO2}$) and the physical thickness ($T_{SiO2}$) of a $SiO_2$ gate dielectric layer, the dielectric constant ($\varepsilon_{HK}$), the physical thickness ($T_{HK}$) and the equivalent oxide thickness ($EOT_{HK}$) of a high-k (or high-∈) metal oxide gate dielectric layer (with a dielectric constant higher than that of silicon dioxides) are shown in Formula (2):

$$C = \frac{\varepsilon_{SiO2} \times A}{T_{SiO2}} = \frac{\varepsilon_{HK} \times A}{T_{HK}} = \frac{\varepsilon_{SiO2} \times A}{EOT_{HK}}. \quad \text{Formula (2)}$$

According to Formula (2), since the dielectric constant of metal oxide material is greater than that of silicon dioxides, the metal oxide materials have been proposed as potential gate dielectric materials. The high-k metal oxide gate dielectric layer allows for a larger physical thickness (compared to $SiO_2$) for obtaining a same gate capacitance that can be obtained with a much thinner $SiO_2$ gate dielectric layer. The larger physical thickness of the high-k metal oxide gate dielectric layer can reduce gate leakage currents. High-k metal oxide materials include, for example, aluminum oxide ($Al_2O_3$).

Figure 1:
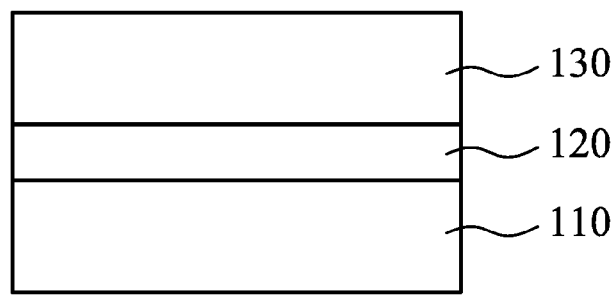
FIG. 1 is a cross-sectional view of an intermediate stage of a process for forming a semiconductor device, in accordance with some embodiments.

FIG. 1 is a cross-sectional view of an intermediate stage of a process for forming a semiconductor device, in accordance with some embodiments. As shown in FIG. 1, a semiconductor substrate 110 is provided. A silicon dioxide buffer layer 120 and a gate dielectric layer 130 are formed on the semiconductor substrate 110 sequentially. The gate dielectric layer 130 is an amorphous dielectric layer, which is made of aluminum oxide. Since the gate dielectric layer 130 is in the amorphous state, the gate dielectric layer 130 may not have a sufficient dielectric constant to maintain the gate capacitance and the performance in a suitable range.

Figure 2:
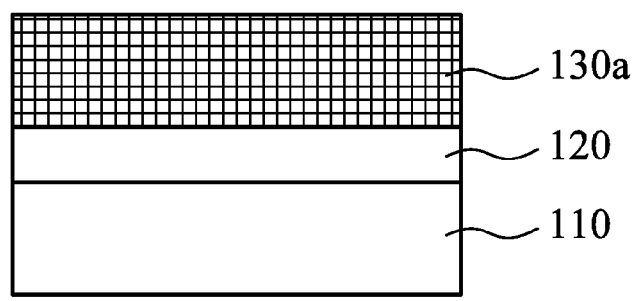
FIG. 2 is a cross-sectional view of an intermediate stage of a process for forming a semiconductor device, in accordance with some embodiments.

To solve the problem mentioned above, the structure in FIG. 1 may be annealed to crystallize the gate dielectric layer 130 into a crystallized gate dielectric layer 130a, as shown in FIG. 2. The crystallized gate dielectric layer 130a has a higher dielectric constant and a lower equivalent oxide thickness than that of the gate dielectric layer 130. However, the crystallized gate dielectric layer 130a results in a large gate leakage current.

Figure 3:
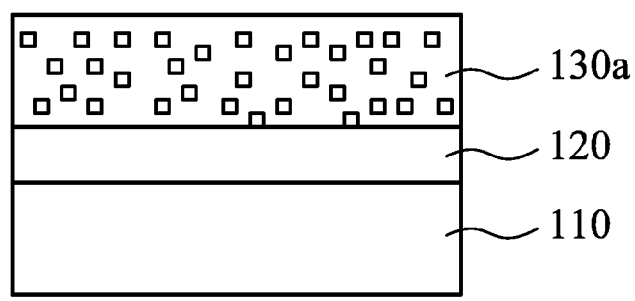
FIG. 3 is a cross-sectional view of an intermediate stage of a process for forming a semiconductor device, in accordance with some embodiments.

To solve the problem mentioned above, a nitrogen plasma treatment is performed on the crystallized gate dielectric layer 130a to lower the crystallinity of the crystallized gate dielectric layer 130a, as shown in FIG. 3. However, since the crystallinity of the crystallized gate dielectric layer 130a is lowered, the dielectric constant is lowered and the equivalent oxide thickness is increased. As a result, the gate capacitance and the performance are low.

Therefore, it is desired to find alternative mechanisms for forming a gate dielectric layer, which has a high dielectric constant and a low equivalent oxide thickness and is able to reduce the gate leakage current.

Figure 4A:
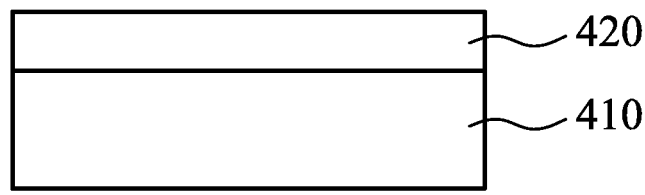
FIGS. 4A-4E are cross-sectional views of various stages of a process for forming a semiconductor device, in accordance with some embodiments.

FIGS. 4A-4E are cross-sectional views of various stages of a process for forming a semiconductor device, in accordance with some embodiments. Referring to FIG. 4A, a semiconductor substrate 410 is provided. The semiconductor substrate 410 may be a semiconductor wafer (such as a silicon wafer) or a portion of a semiconductor wafer.

In some embodiments, the semiconductor substrate 410 is made of an elementary semiconductor material including silicon or germanium in a single crystal, polycrystal, or amorphous structure. In some other embodiments, the semiconductor substrate 410 is made of a compound semiconductor, such as silicon carbide, gallium arsenide, gallium phosphide, indium phosphide, indium arsenide, an alloy semiconductor, such as SiGe, or GaAsP, or combinations thereof.

The semiconductor substrate 410 may also include multi-layer semiconductors, semiconductor on insulator (SOI) (such as silicon on insulator or germanium on insulator), or combinations thereof. The semiconductor substrate 410 may be treated by a chemical cleaning process and/or a dipping process with a hydrofluoric acid.

Afterwards, a buffer layer (also referred to as an interfacial layer) 420 is formed over the semiconductor substrate 410. In some embodiments, the buffer layer 420 is in direct contact with the semiconductor substrate 410. In some embodiments, the buffer layer 420 is made of (high-k) dielectric materials with a dielectric constant higher than that of silicon dioxides. For example, the buffer layer 420 is made of metal oxides, such as aluminum oxides ($Al_2O_3$), cerium oxides ($CeO_2$), hafnium aluminum oxides (HfAlO), lanthanum aluminum oxides ($LaAlO_3$) or other suitable high-k metal oxide materials.

The buffer layer 420 is deposited by using a chemical vapor deposition (CVD) process, an atomic layer deposition (ALD) process or other suitable deposition processes. In some embodiments, the ALD process includes a remote plasma atomic layer deposition (RP-ALD) process.

The deposition temperature of the buffer layer 420 may range from about 50° C. to about 450° C. In some embodiments, the buffer layer 420 includes aluminum oxides, and the deposition temperature may be about 250° C. The buffer layer 420 is in an amorphous state, in accordance with some embodiments. In some other embodiments, the buffer layer 420 is made of silicon dioxides.

Figure 4B:
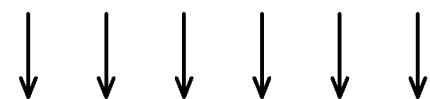
Figure 4B:
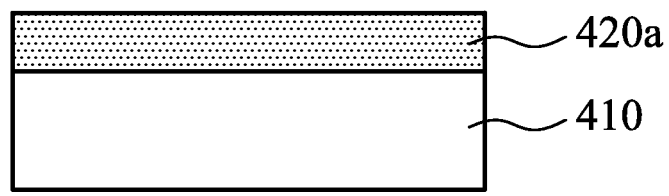

Then, as shown in FIG. 4B, a nitridation process is performed on the buffer layer 420 to convert the buffer layer 420 into a nitride buffer layer 490a. The nitridation process includes a nitrogen plasma treatment (e.g. a remote nitrogen plasma treatment) or other suitable nitridation treatments. The nitridation process may be performed by applying an ammonia gas ($NH_3$) at a flow rate of 20 sccm (standard cubic centimeters per minute) at 250° C. for 3 minutes.

The nitride buffer layer 420a may have a higher dielectric constant than that of the buffer layer 420. The nitridation process may reduce the gate leakage current by filling the oxygen vacancies in the buffer layer 420 with nitrogen. Furthermore, the nitrogen in the nitride buffer layer 420a may prevent the nitride buffer layer 420a from being converted from the amorphous state into a crystalline state in subsequent annealing processes. Therefore, the nitride buffer layer 420a in the amorphous state may effectively reduce the gate leakage current.

Besides, the nitrogen ions in the nitride buffer layer 420a may react with the semiconductor substrate 410 to form an interfacial layer (not shown) between the nitride buffer layer 420a and the semiconductor substrate 410. The interfacial layer includes, for example, a silicon nitride film. The interfacial layer may prevent the oxygen in the nitride buffer layer 420a from reacting with the semiconductor substrate 410, which avoids forming an undesired oxide film (i.e. a low-k film) between the nitride buffer layer 420a and the semiconductor substrate 410.

Figure 4C:
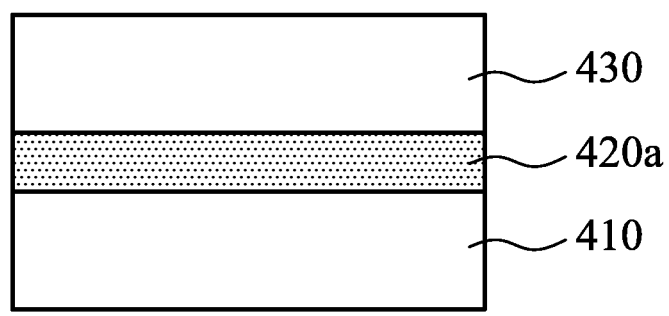

Afterwards, as shown in FIG. 4C, a gate dielectric layer 430 is deposited over the nitride buffer layer 420a. In some embodiments, the gate dielectric layer 430 is in direct contact with the nitride buffer layer 420a. The gate dielectric layer 430 is made of high-k metal oxide materials, such as zirconium oxides ($ZrO_2$), gadolinium oxides ($Gd_2O_3$), hafnium oxides ($HfO_2$), barium titanium oxides ($BaTiO_3$) or aluminum oxides ($Al_2O_3$).

In some embodiments, the gate dielectric layer 430 includes zirconium oxides, and the buffer layer 420 (or the nitride buffer layer 420a) includes aluminum oxides. In some embodiments, the gate dielectric layer 430 has a dielectric constant higher than that of the nitride buffer layer 420a (or the buffer layer 420). For example, the dielectric constant of the gate dielectric layer 430 is in a range from about 9 to about 80.

The gate dielectric layer 430 is deposited by using a chemical vapor deposition (CVD) process, an atomic layer deposition (ALD) process or other suitable deposition processes. In some embodiments, the ALD process includes a remote plasma atomic layer deposition (RP-ALD) process. In some embodiments, the deposition temperature of the gate dielectric layer 430 may range from about 50° C. to about 450° C. In some embodiments, the gate dielectric layer 430 includes zirconium oxides, and the deposition temperature of the gate dielectric layer 430 may be about 250° C.

Figure 4D:
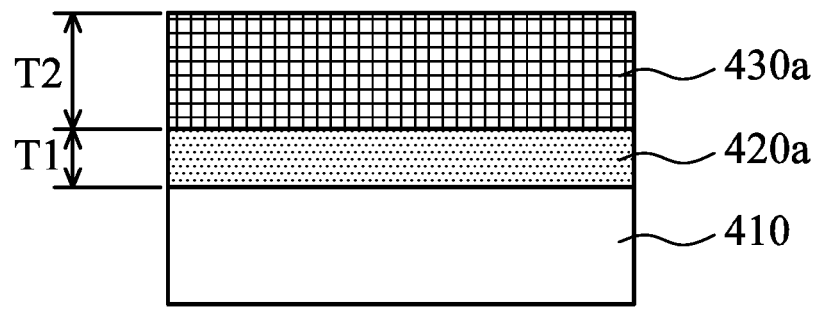

Afterwards, as shown in FIG. 4D, a thermal annealing process is performed to crystallize the gate dielectric layer 430 into a crystalline gate dielectric layer 430a. The crystalline gate dielectric layer 430a has a higher dielectric constant and a lower equivalent oxide thickness than that of the gate dielectric layer 430 in an amorphous state (or in a low crystalline state). Therefore, the gate capacitance is improved, and the performance of the semiconductor device using the crystalline gate dielectric layer 430a is improved as well.

In some embodiments, the crystalline gate dielectric layer 430a (or the gate dielectric layer 430) and the nitride buffer layer 420a (or the buffer layer 420) are made of different materials. In some embodiments, the crystalline gate dielectric layer 430a has a dielectric constant higher than that of the nitride buffer layer 420a (or the buffer layer 420).

The thermal annealing temperature may range from about 200° C. to about 1000° C. In some embodiments, the gate dielectric layer 430 including zirconium oxides may be annealed at about 450° C. to be crystallized into the crystalline gate dielectric layer 430a having a tetragonal phase. The crystalline gate dielectric layer 430a with the tetragonal phase has a high dielectric constant ranging from, for example, about 40 to about 50.

The thickness T1 of the nitride buffer layer 420a may range from 0.1 nm to several nm. In some embodiments, the nitride buffer layer 420a is made of aluminum oxides, and the thickness T1 is about 1 nm. The thickness T2 of the crystalline gate dielectric layer 430a may range from 0.2 nm to several nm. In some embodiments, the crystalline gate dielectric layer 430a is made of zirconium oxides, and the thickness T2 is about 5.5 nm. In some embodiments, the thickness T2 is larger than the thickness T1.

In some embodiments, the nitrogen in the nitride buffer layer 420a may prevent (or inhibit) the nitride buffer layer 420a from being converted into a crystalline state. Therefore, the nitride buffer layer 420a is still in a substantially amorphous state after the thermal annealing process, and the nitride buffer layer 420a after the thermal annealing process is able to effectively reduce the gate leakage current.

In some embodiments, the thermal annealing temperature is lower than the crystallization temperature of the nitride buffer layer 420a to prevent the nitride buffer layer 420a from being crystallized. That is, the crystallization temperature of the gate dielectric layer 430 may be lower than that of the nitride buffer layer 420a.

Figure 4E:
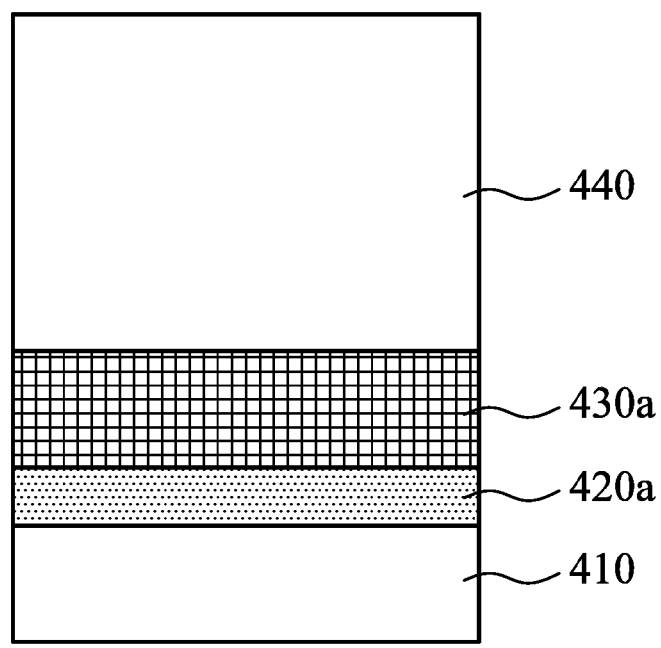

Then, referring to FIG. 4E, a gate electrode 440 is deposited over the crystalline gate dielectric layer 430a. The gate electrode 440 is made of polysilicon, metal materials or alloy materials, in accordance with some embodiments. The metal materials of the gate electrode 440 may include aluminum, tungsten, gold, platinum, cobalt, other suitable metals, alloys thereof, or combinations thereof. The gate electrode 440 may be deposited by using a PVD process, a CVD process, a plating process, a sputtering process, the like, or combinations thereof.

The nitride buffer layer 420a and the crystalline gate dielectric layer 430a may be used in various transistors. Some of the transistors are exemplarily illustrated as follows, but the present disclosure is not limited thereto.

Figure 5:
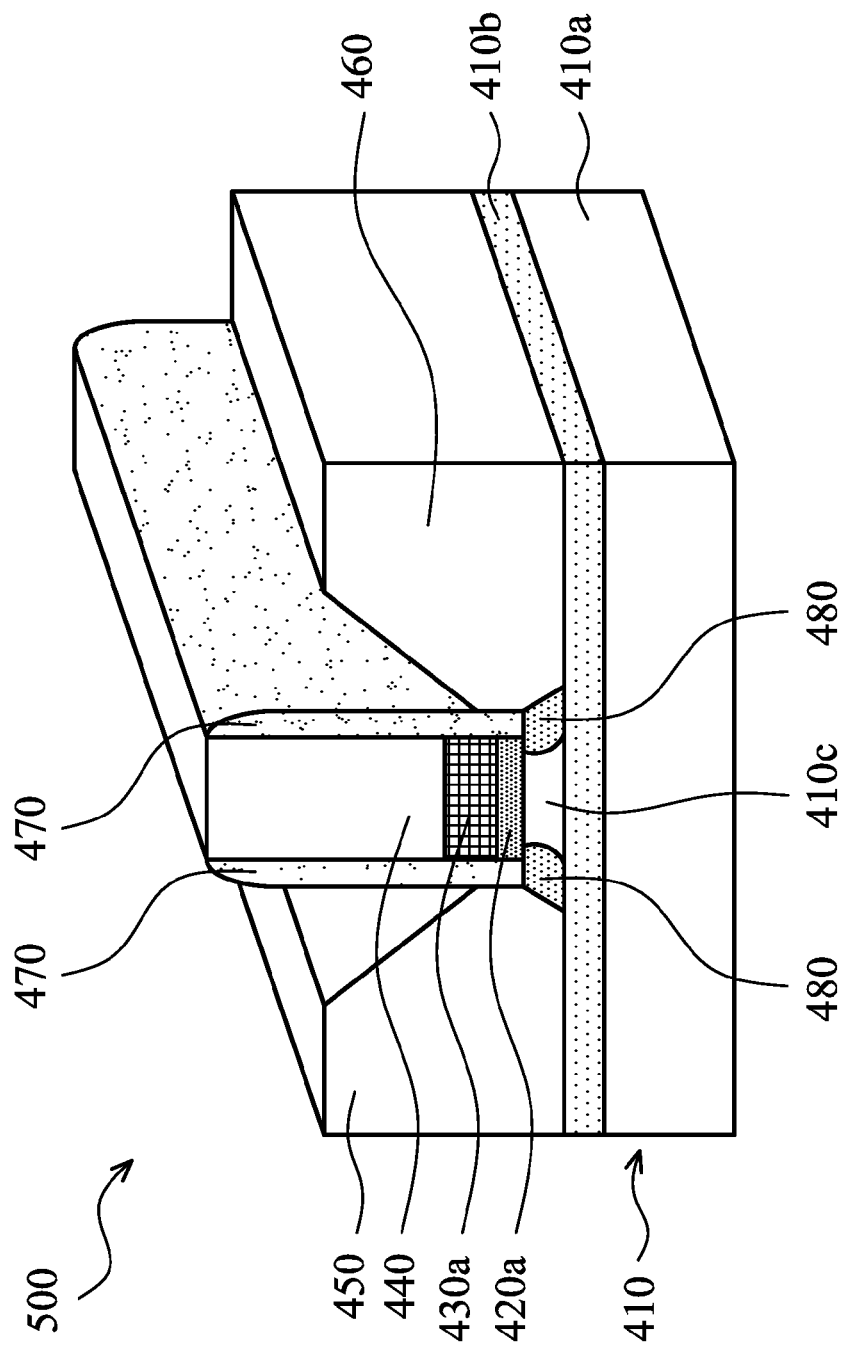
FIG. 5 is a perspective view of a planar field effect transistor (planar FET), in accordance with some embodiments.

FIG. 5 is a perspective view of a planar field effect transistor (planar FET), in accordance with some embodiments. As shown in FIG. 5, a planar field effect transistor 500 includes the semiconductor substrate 410, the nitride buffer layer 420a, the crystalline gate dielectric layer 430a, the gate electrode 440, a source 450 and a drain 460, in accordance with some embodiments.

In some embodiments, the semiconductor substrate 410 is a semiconductor on insulator (SOI) substrate. The semiconductor substrate 410 may include a bottom bulk semiconductor layer 410a (also referred to as "bulk" or "bulk layer"), a buried insulating layer 410b (also referred to as "BOX"), and a semiconductor layer 410c (also referred to as "SOI" or "SOI layer") over the top of the buried insulating layer 410b. Alternatively, in some other embodiments, the semiconductor substrate 410 may be a single-layer semiconductor substrate.

The nitride buffer layer 420a, the crystalline gate dielectric layer 430a and the gate electrode 440 are sequentially formed over the semiconductor layer 410c by the methods shown in FIGS. 4A-4E. In some embodiments, spacers 470 are formed over sidewalls of the nitride buffer layer 420a, the crystalline gate dielectric layer 430a and the gate electrode 440. The spacers 470 may be made of a dielectric material, such as silicon nitrides, silicon oxynitrides, or combinations thereof. In some embodiments, lightly doped regions 480 are formed in the semiconductor layer 410c and are located under the spacers 470 and the nitride buffer layer 420a.

The source 450 and the drain 460 are formed over the buried insulating layer 410b and are formed at two opposite sides of the gate electrode 440, in accordance with some embodiments. That is, the nitride buffer layer 420a, the crystalline gate dielectric layer 430a and the gate electrode 440 are located between the source 450 and the drain 460. The spacers 470 separate the gate electrode 440 from the source 450 and the drain 460.

Figure 6:
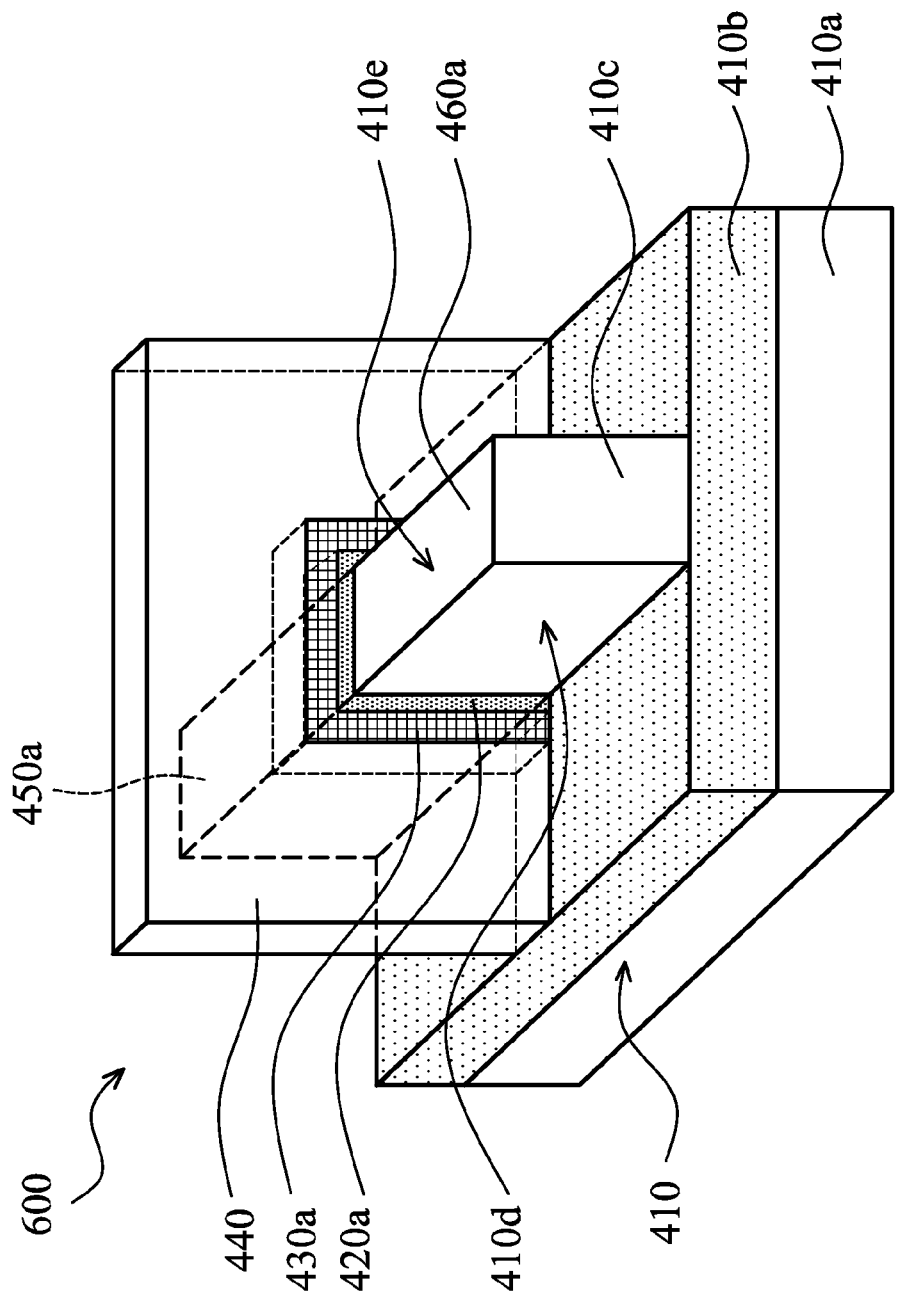
FIG. 6 is a perspective view of a fin field effect transistor (Fin-FET), in accordance with some embodiments.

FIG. 6 is a perspective view of a fin field effect transistor (Fin-FET), in accordance with some embodiments. As shown in FIG. 6, a fin field effect transistor 600 includes the semiconductor substrate 410, the nitride buffer layer 420a, the crystalline gate dielectric layer 430a, the gate electrode 440, a source region 450a and a drain region 460a, in accordance with some embodiments.

In some embodiments, the semiconductor substrate 410 is a semiconductor on insulator (SOI) substrate. The semiconductor substrate 410 may include a bottom bulk semiconductor layer 410a, a buried insulating layer 410b, and a semiconductor layer (also referred to as "SOI" or "SOI layer") 410c on the top of the buried insulating layer 410b. The semiconductor layer 410c is a fin-shaped structure. The source region 450a and the drain region 460a are formed in the semiconductor layer 410c.

The nitride buffer layer 420a, the crystalline gate dielectric layer 430a and the gate electrode 440 are sequentially formed over the sidewalls 410d and the top surface 410e of the semiconductor layer 410c by the methods shown in FIGS. 4A-4E. The nitride buffer layer 420a, the crystalline gate dielectric layer 430a, the gate electrode 440 are located between the source region 450a and the drain region 460a.

Figure 7:
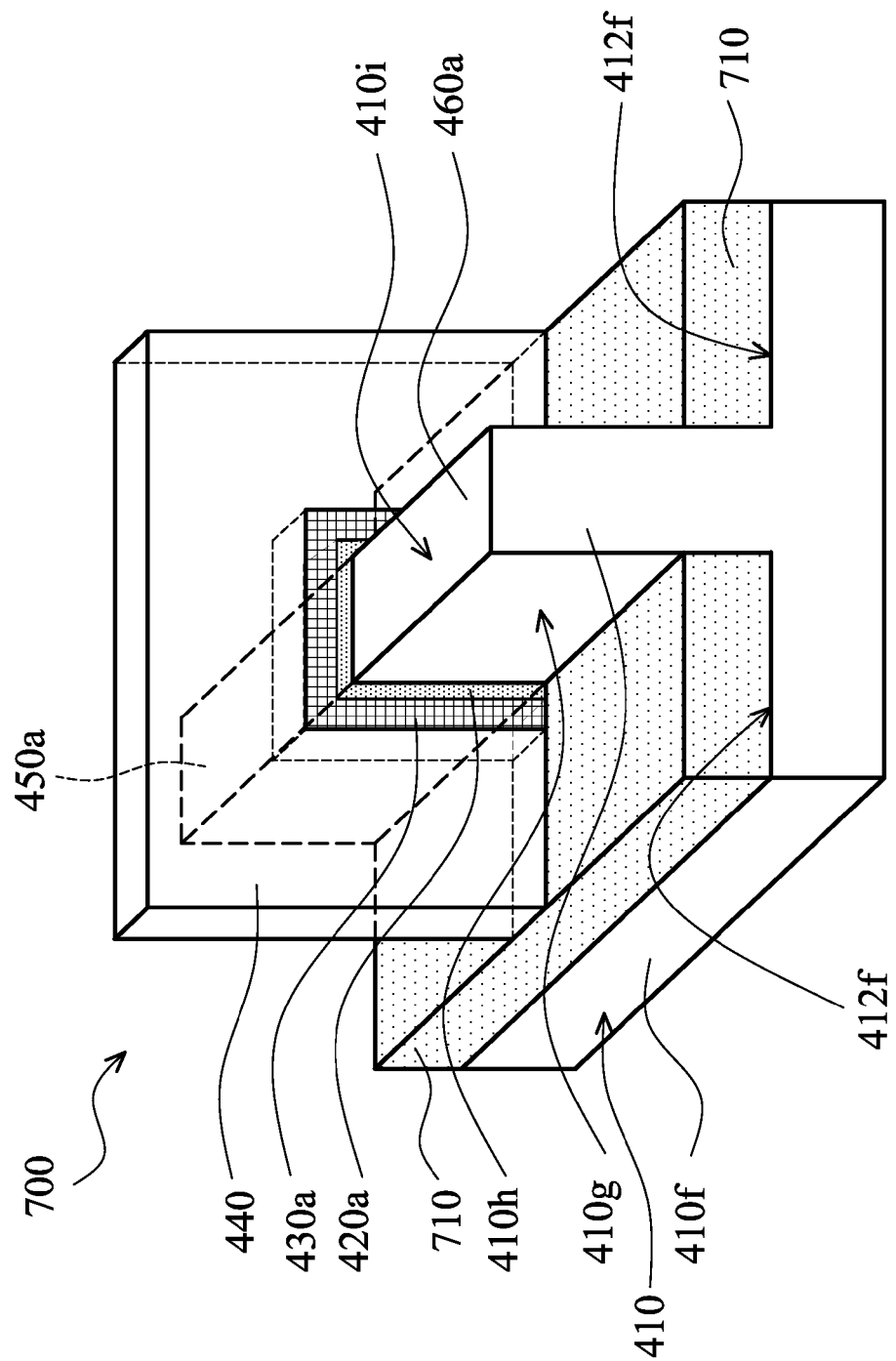
FIG. 7 is a perspective view of a bulk fin field effect transistor (Bulk Fin-FET), in accordance with some embodiments.

FIG. 7 is a perspective view of a bulk fin field effect transistor (Bulk Fin-FET), in accordance with some embodiments. As shown in FIG. 7, a bulk fin field effect transistor 700 includes the semiconductor substrate 410, the nitride buffer layer 420a, the crystalline gate dielectric layer 430a, the gate electrode 440, a source region 450a, a drain region 460a and an insulating layer 710, in accordance with some embodiments.

In some embodiments, the semiconductor substrate 410 is a bulk semiconductor substrate. The semiconductor substrate 410 may include a semiconductor layer 410f and a fin-shaped structure 410g over a top surface 412f of the semiconductor layer 410f. The source region 450a and the drain region 460a are formed in the fin-shaped structure 410g. The insulating layer 710 is formed over the top surface 412f exposed by the fin-shaped structure 410g. The insulating layer 710 may include, for example, silicon oxides or silicon nitrides.

The nitride buffer layer 420a, the crystalline gate dielectric layer 430a and the gate electrode 440 are sequentially formed over the sidewalls 410h and the top surface 410i of the fin-shaped structure 410g by the methods shown in FIGS. 4A-4E. A portion of the nitride buffer layer 420a, the crystalline gate dielectric layer 430a and the gate electrode 440 is located over the insulating layer 710. The nitride buffer layer 420a, the crystalline gate dielectric layer 430a and the gate electrode 440 are located between the source region 450a and the drain region 460a.

Embodiments of mechanisms for forming a semiconductor device described above nitride the buffer layer into the nitride buffer layer to reduce the gate leakage current. Furthermore, the embodiments of the mechanisms crystallize the gate dielectric layer into the crystalline gate dielectric layer to increase the dielectric constant and to lower the equivalent oxide thickness. Due to the nitrogen in the nitride buffer layer may inhibit the crystallization of the nitride buffer layer during the crystallization of the gate dielectric layer, the nitride buffer layer is maintained in the amorphous state and therefore could reduce the gate leakage current. Therefore, the gate capacitance is improved, and the performance of the semiconductor device using the crystalline gate dielectric layer is improved as well.

In accordance with some embodiments, a semiconductor device is provided. The semiconductor device includes a semiconductor substrate and a nitride buffer layer over the semiconductor substrate, wherein the nitride buffer layer is in an amorphous state. The semiconductor device also includes a crystalline gate dielectric layer over the nitride buffer layer and a gate electrode over the crystalline gate dielectric layer.

In accordance with some embodiments, a semiconductor device is provided. The semiconductor device includes a semiconductor substrate and a nitride buffer layer over the semiconductor substrate, wherein the nitride buffer layer is in an amorphous state. The nitride buffer layer has a dielectric constant larger than that of silicon dioxides. The semiconductor device also includes a crystalline gate dielectric layer over the nitride buffer layer and a gate electrode over the crystalline gate dielectric layer.

In accordance with some embodiments, a method for forming a semiconductor device is provided. The method includes providing a semiconductor substrate and forming a buffer layer over the semiconductor substrate, wherein the buffer layer is in an amorphous state. The method also includes nitriding the buffer layer into a nitride buffer layer and forming a gate dielectric layer over the nitride buffer layer. The method further includes performing a thermal annealing process to crystallize the gate dielectric layer into a crystalline gate dielectric layer and forming a gate electrode over the crystalline gate dielectric layer.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device, comprising:
a semiconductor substrate;
a nitride buffer layer over the semiconductor substrate, wherein the nitride buffer layer is in an amorphous state;
a crystalline gate dielectric layer over the nitride buffer layer; and
a gate electrode over the crystalline gate dielectric layer.

2. The semiconductor device as claimed in claim 1, wherein the nitride buffer layer comprises metal oxides.

3. The semiconductor device as claimed in claim 2, wherein the nitride buffer layer comprises aluminum oxides, cerium oxides, hafnium aluminum oxides, lanthanum aluminum oxides and combinations thereof.

4. The semiconductor device as claimed in claim 1, wherein the crystalline gate dielectric layer and the nitride buffer layer are made of different materials.

5. The semiconductor device as claimed in claim 1, wherein the crystalline gate dielectric layer has a dielectric constant higher than that of the nitride buffer layer.

6. The semiconductor device as claimed in claim 1, wherein the crystalline gate dielectric layer comprises a first metal oxide, and the nitride buffer layer comprises a second metal oxide, which is different from the first metal oxide.

7. The semiconductor device as claimed in claim 1, wherein the crystalline gate dielectric layer comprises zirconium oxides, and the nitride buffer layer comprises aluminum oxides.

8. The semiconductor device as claimed in claim 1, further comprising:
a source over the semiconductor substrate; and
a drain over the semiconductor substrate, wherein the nitride buffer layer, the crystalline gate dielectric layer and the gate electrode are between the source and the drain.

9. The semiconductor device as claimed in claim 1, wherein the semiconductor substrate is a semiconductor on insulator substrate, the semiconductor substrate comprises a semiconductor on insulator layer with a fin shape, a source region and a drain region are in the semiconductor on insulator layer, wherein
the nitride buffer layer, the crystalline gate dielectric layer and the gate electrode are over sidewalls and a top surface of the semiconductor on insulator layer and are between the source region and the drain region.

10. The semiconductor device as claimed in claim 1, wherein the semiconductor substrate is a bulk semiconductor substrate and has a fin-shaped structure, a source region and a drain region are in the fin-shaped structure, wherein
the nitride buffer layer, the crystalline gate dielectric layer and the gate electrode are over sidewalls and a top surface of the fin-shaped structure and are between the source region and the drain region.

11. A semiconductor device, comprising:
a semiconductor substrate;
a nitride buffer layer over the semiconductor substrate, wherein the nitride buffer layer is in an amorphous state, and the nitride buffer layer has a dielectric constant larger than that of silicon dioxides;
a crystalline gate dielectric layer over the nitride buffer layer; and
a gate electrode over the crystalline gate dielectric layer.

12. The semiconductor device as claimed in claim 11, wherein the crystalline gate dielectric layer comprises zirconium oxides with a tetragonal phase.

13. The semiconductor device as claimed in claim 11, wherein the crystalline gate dielectric layer has a dielectric constant higher than that of the nitride buffer layer.

14. The semiconductor device as claimed in claim 13, wherein the crystalline gate dielectric layer comprises gadolinium oxides, hafnium oxides, barium titanium oxides, aluminum oxides, zirconium oxides or combinations thereof.

15. The semiconductor device as claimed in claim 11, wherein the nitride buffer layer comprises metal oxides.

16. The semiconductor device as claimed in claim 15, wherein the nitride buffer layer comprises aluminum oxides, cerium oxides, hafnium aluminum oxides, lanthanum aluminum oxides and combinations thereof.

17. The semiconductor device as claimed in claim 11, wherein the crystalline gate dielectric layer and the nitride buffer layer are made of different materials.

18. The semiconductor device as claimed in claim 11, wherein the crystalline gate dielectric layer comprises a first metal oxide, and the nitride buffer layer comprises a second metal oxide, which is different from the first metal oxide.

19. The semiconductor device as claimed in claim 11, wherein the crystalline gate dielectric layer comprises zirconium oxides, and the nitride buffer layer comprises aluminum oxides.

20. The semiconductor device as claimed in claim 11, wherein the semiconductor substrate is a bulk semiconductor substrate and has a fin-shaped structure, a source region and a drain region are in the fin-shaped structure, wherein
    the nitride buffer layer, the crystalline gate dielectric layer and the gate electrode are over sidewalls and a top surface of the fin-shaped structure and are between the source region and the drain region.

\* \* \* \* \*